US006647618B2

(12) United States Patent
Wortman

(10) Patent No.: US 6,647,618 B2
(45) Date of Patent: Nov. 18, 2003

(54) METHOD OF ASSEMBLING A CIRCUIT BOARD INTO A HOUSING

(75) Inventor: Michael Wortman, Roseville, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 161 days.

(21) Appl. No.: 09/935,605

(22) Filed: Aug. 22, 2001

(65) Prior Publication Data

US 2001/0053067 A1 Dec. 20, 2001

Related U.S. Application Data

(62) Division of application No. 09/358,952, filed on Jul. 22, 1999, now Pat. No. 6,304,456.

(51) Int. Cl.[7] .............................................. H01R 43/00
(52) U.S. Cl. .......................... 29/825; 29/830; 361/752; 439/327
(58) Field of Search ......................... 29/825, 830–832, 29/834, 842; 361/725, 730, 752, 756, 759, 801; 439/327

(56) References Cited

U.S. PATENT DOCUMENTS 4,914,552 A * 4/1990 Kecmer ...................... 361/801
5,191,514 A * 3/1993 Kabat et al. ................ 361/802
5,391,091 A * 2/1995 Nations ...................... 439/378
5,453,912 A * 9/1995 Lytle et al. ................. 361/814
5,467,254 A * 11/1995 Brusati et al. .............. 361/799
5,594,627 A * 1/1997 Le ............................. 361/801
5,761,045 A * 6/1998 Olson et al. ................ 361/726
6,166,917 A * 12/2000 Anderson ................... 361/756

* cited by examiner

Primary Examiner—Peter Vo
Assistant Examiner—Donghai Nguyen
(74) Attorney, Agent, or Firm—David A. Plettner

(57) ABSTRACT

A method of assembling a circuit board into a housing to form an assembly is disclosed. The method includes inserting a first end of the circuit board into a first slot of the housing, flexing the circuit board over a deflection/retention feature, inserting a second end of the circuit board into a second slot of the housing, and pressing the circuit board into place until the circuit board clears the deflection/retention feature and snaps into place. The circuit board thereafter returns to a substantially flat state. Moreover, inserting a first end of the circuit board into a first slot of the housing and inserting a second end of the circuit board into a second slot of the housing each include simplifying initial alignment of the circuit board into the slot by first contacting a lower surface of the slot that extends farther from a front of the housing than an upper surface of the slot.

7 Claims, 7 Drawing Sheets

METHOD OF ASSEMBLING A CIRCUIT BOARD INTO A HOUSING

This application is a divisional of application Ser. No. 09/358,952, filed on Jul. 22, 1999, now U.S. Pat. No. 6,304,456.

FIELD OF THE INVENTION

The present invention relates to housing and circuit board assemblies. More specifically, the present invention relates to a housing having retention features that guide a circuit board into place, uses the flexible nature of the circuit board to retain the circuit board in the housing, and includes a connector system having tapered alignment posts.

DESCRIPTION OF THE RELATED ART

In the art of computing, as well as other arts, it is common to provide a housing in which are mounted switches, indicator lights, and other similar components. Often these components are individually retained to the housing using fasteners, adhesives, or other methods known in the art. Typically, the components are then coupled to other circuits using individual wires, ribbon cables, or other methods known in the art.

A more sophisticated method of attaching these components to the housing is to mount the components on a single circuit board, and then mount the circuit board to the housing. Typically, the circuit board is attached to the housing using fasteners, adhesives, or other methods known in the art. Using a circuit board decreases assembly steps because all components are attached to the housing by simply attaching the circuit board to the housing. Also, a single connector or cable can be used to couple the components on the circuit board to the circuits which must interface with the components.

While using a circuit board decreases assembly steps, it still must be fastened into place. Therefore, any method or apparatus that would simplify the process of assembling the circuit board into the housing would be highly desirable.

SUMMARY OF THE INVENTION

The present invention provides an assembly comprising a housing and a circuit board, and includes a simplified method of assembling the circuit board into the housing, along with a simplified method of coupling electrical signals from the circuit board to other circuits.

The circuit board is guided into place by a pair of slots, with each slot located proximate an end of the housing. The housing includes a support member that has a deflection/retention feature that extends above a plane formed by the circuit board after the board has been assembled to the housing. When a technician desires to assemble the circuit board into the housing, the technician first partially inserts one end of the board into a slot. As the technician presses on the other end of the board toward another slot, a curved guide deflects the board downward and into the other slot. At this point, both ends of the circuit board are inserted into slots, and the deflection/retention feature is in contact with the board and flexes the board upward.

As the technician continues to press the board forward, a second curved guide engages the board and urges the board downward toward its final position. Finally, the board clears the deflection/retention feature and snaps into place.

The present invention also includes a novel method of creating electrical connections to the circuit board. One of the connectors that is used to form the connection includes a pair of tapered alignment posts. When a technician seeks to fasten the assembly to the system that it will eventually be a part of (such as a computer system), the technician simply aligns the tapered alignment posts with corresponding holes proximate the other connector, and urges the assembly into place. Thereafter, the technician simply fastens the assembly to the system using a conventional fasteners, such as a bolts or screws, or any other method known in the art.

The present invention provides a simple method of installing a circuit board into a housing to form an assembly, and then electrically coupling the assembly to the system to which it is mounted, thereby lowering assembly costs.

DETAILED DESCRIPTION OF THE PREFERRED EMBODIMENTS

Figure 1:
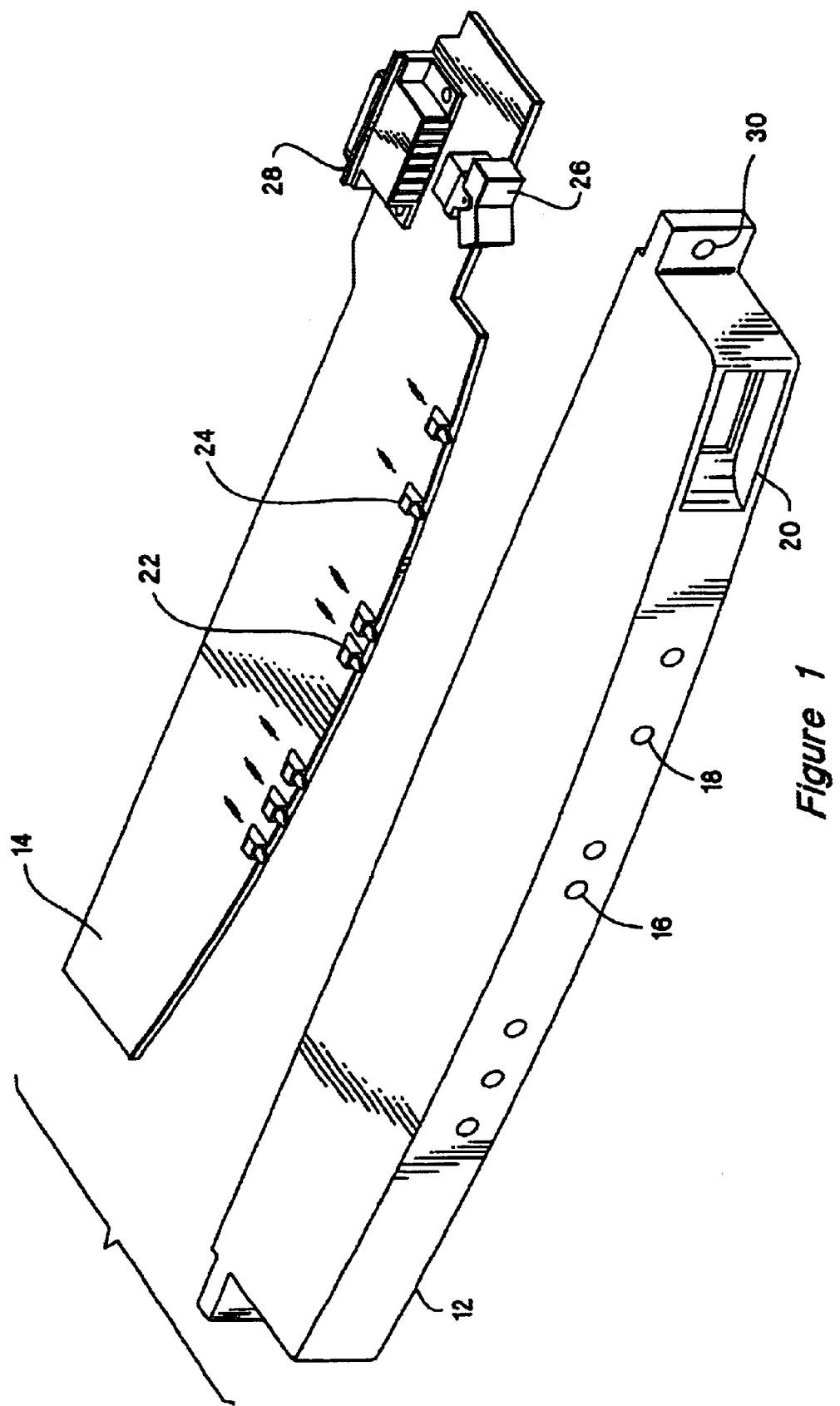
FIG. 1 shows a housing and circuit board assembly in accordance with the present invention.

The present invention provides an assembly comprising a housing and a circuit board and includes a simplified method of assembling the circuit board into the housing, along with a simplified method of coupling the electrical signals from the circuit board to other circuits. FIG. 1 shows a housing and circuit board assembly 10 in accordance with the present invention. Assembly 10 comprises a housing 12 and a circuit board 14.

Housing 12 includes a plurality of indicator light holes, such as indicator light holes 16 and 18, through which indicator lights are visible when circuit board 14 is assembled into housing 12. Housing 12 also includes a switch hole 20 through which a switch on circuit board 14 maybe manipulated when circuit board 14 is assembled into housing 12. Finally, housing 12 has a pair of mounting holes for mounting assembly 12 to a computer system. Mounting hole 30 is shown in FIG. 1.

Circuit board 14 includes a plurality of components that correspond to the holes of housing 12. For example, when circuit board 14 is mounted into housing 12, indicator light 22 and 24 are visible through indicator light holes 16 and 18, respectively, and switch 26 may be manipulated through hole 20. Circuit board 14 also includes connector 28, which electrically couples the components of board 14 to a computer system when assembly 10 is mounted to a computer system. The present invention has several features that greatly simplifies the assembly of circuit board 14 into housing 12. These features are shown in the remainder of the Figures.

Figure 2:
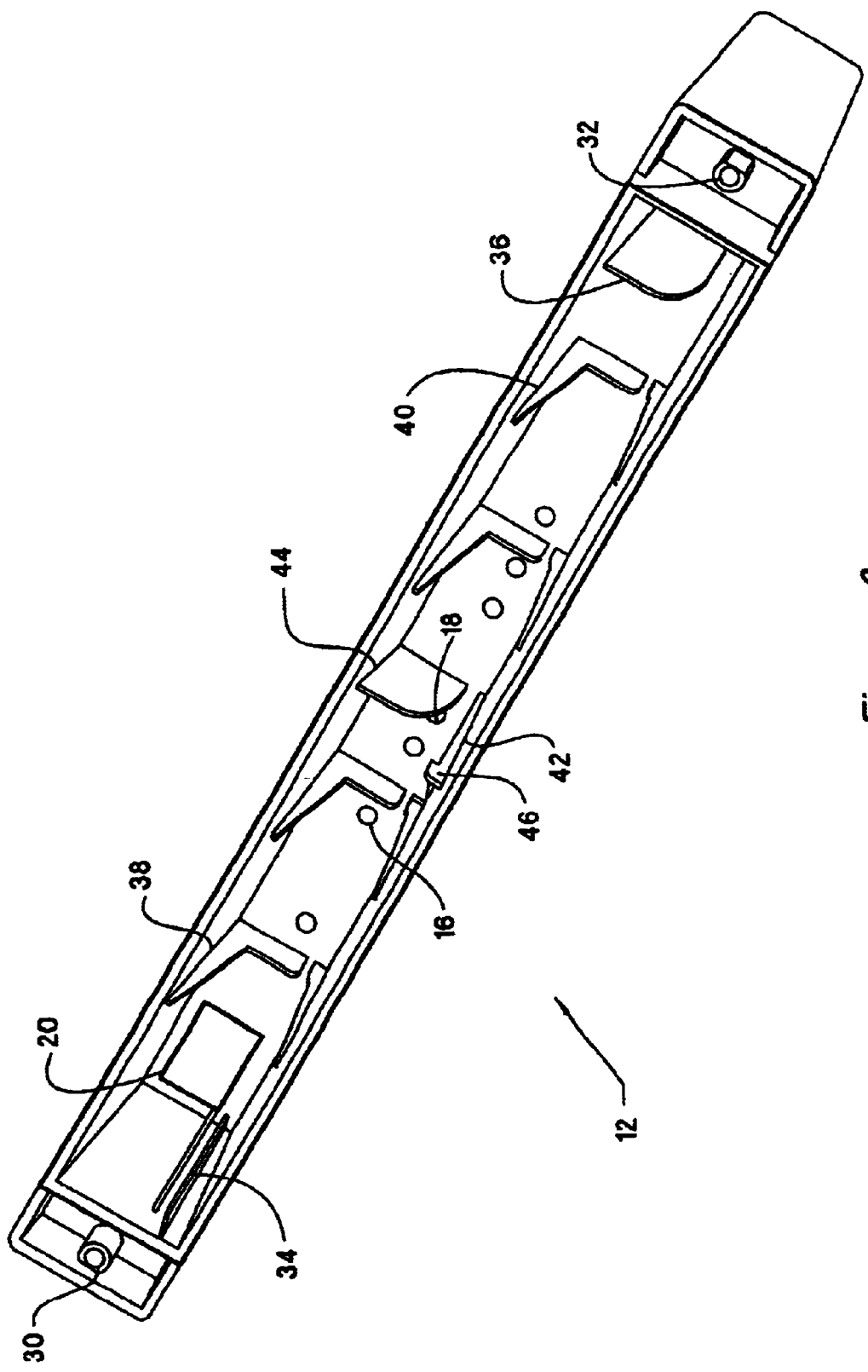
FIG. 2 is a rear perspective view of the housing shown in FIG. 1.

FIG. 2 is a rear perspective view of housing 12. The other mounting hole (hole 32) is also shown in FIG. 2. Circuit board 14 is guided into place by a pair of slots, with each slot located proximate an end of housing 12. Slot 34 is visible in FIG. 2. Note that the lower surface of slot 34 extends farther from the front of housing 12 than the upper surface of slot 32. This simplifies the initial alignment of circuit board 14 into slot 34.

Figure 3:
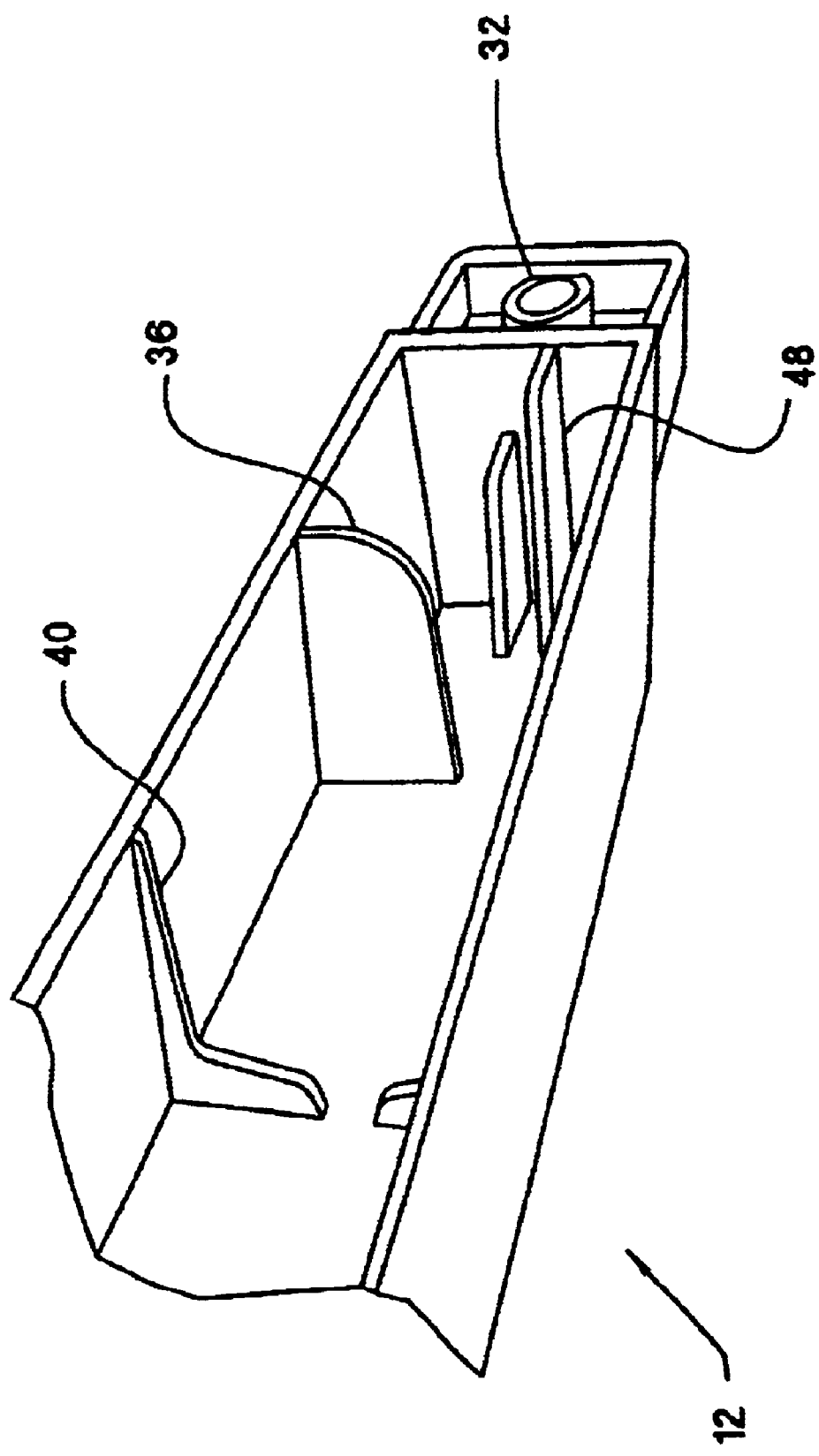
FIG. 3 is a partial rear perspective view of the housing shown in FIG. 1, and shows a slot that is located on the opposite end of the housing.

FIG. 3 is a partial rear perspective view of housing 12 and shows slot 48, which is located on the opposite end of housing 12. As with slot 34, slot 48 includes a lower surface that extends farther from the front of housing 12 than the upper surface. Located proximate to slot 48 is curved guide 36, which simplifies the assembly of circuit board 14 into housing 12 and will be discussed in greater detail below. While slots 34 and 48 help guide board 14 into place, the slots also help retain board 14 in place after assembly.

Returning to FIG. 2, housing 12 also includes four supports, such as supports 38 and 40, which help retain circuit board 14 in place when board 12 is assembled into housing 12. Support member 42 and curved guide 44 also function to support board 14 when assembled. However, support member 42 and guide 44 serve an additional assembly-related function. Note that support member 42 includes deflection/retention feature 46. Feature 46 extends above the plane formed by circuit board 14 after board 14 is assembled to housing 12.

Accordingly, when a technician desires to assemble circuit board 14 into housing 12, the technician first partially inserts the first end of board 14 (the end which includes switch 26) into slot 34 such that the upper and lower surfaces of slot 34 support board 14. When board 14 is flat, deflection/retention feature 46 will cause the other end of board 14 to be located above slot 48. At this point, curved guide 36 assists assembly. As the technician presses on the second end of board 14, curved guide 36 deflects the board downward and into slot 48. Note that curved guide 36 extends farther from the front of housing 12 than does curved guide 44. Accordingly, curved guide 36 engages board 14 first, and at this point, curved guide 44 has not engaged 14.

Figure 4:
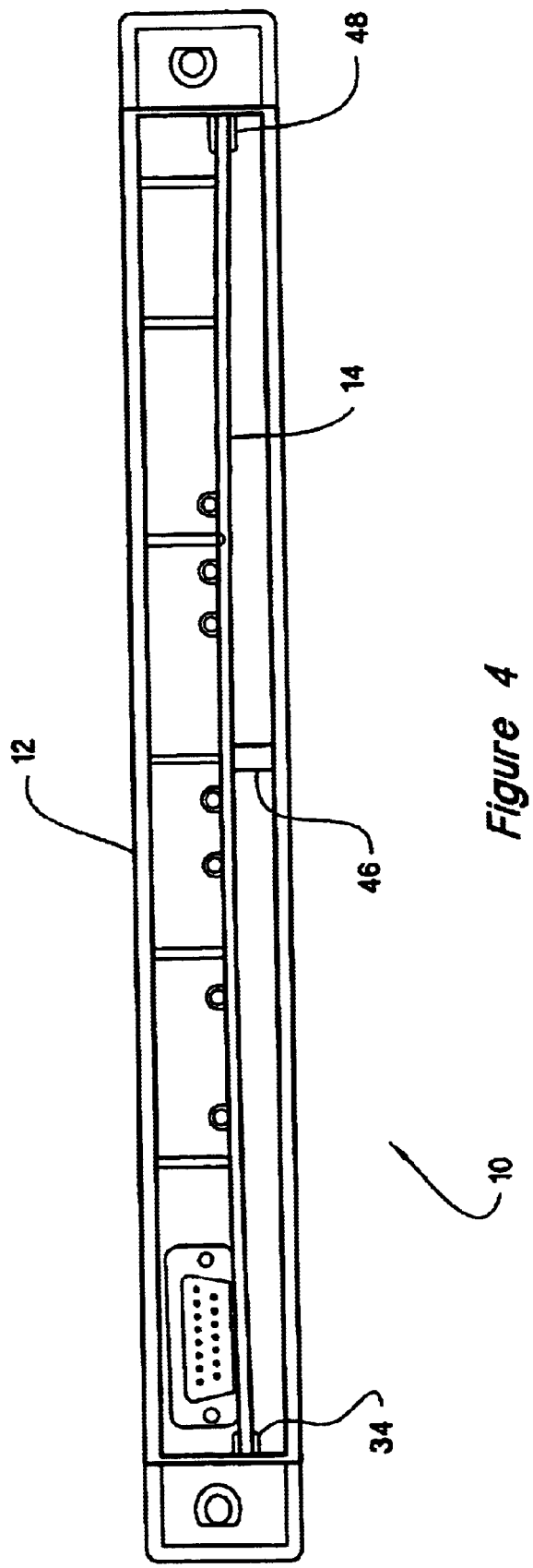
FIG. 4 illustrates the assembly of FIG. 1 at a certain point in the assembly process, with one end of the circuit board inserted into one slot, the other end of board inserted into another slot, and a deflection/retention feature in contact with board and flexing the board upward.

FIG. 4 illustrates assembly 10 at this point in the assembly process. One end of circuit board 14 is inserted into slot 34 and the other end of board 14 is inserted into slot 48. Deflection/retention feature 46 is in contact with board 14, and flexes board 14 upward. The technician assembling board 14 into housing 12 continues to press board 14 forward. At this point, curved guide 44 engages board 14 and urges board 14 downward toward its final position. Finally, board 14 is pressed forward until board 14 clears feature 46 and snaps into place. This is shown in FIG. 5.

Figure 5:
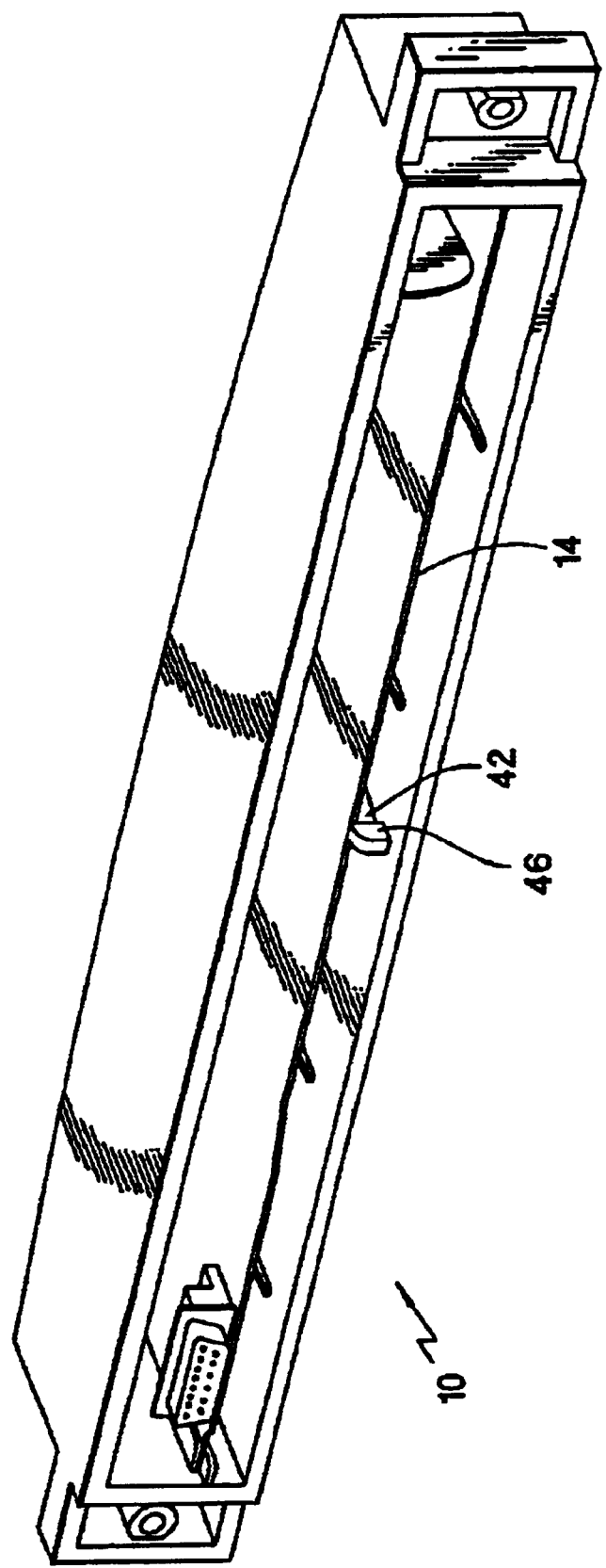
FIG. 5 shows the assembly of FIG. 1 after the circuit board has been assembled into the housing.

As seen in FIG. 5, circuit board 14 has been assembled into housing 12, thereby forming assembly 10. After board 14 has been pushed forward, the inherent resiliency of board 14 causes board 14 to return to a flat state, thereby causing board 14 to come to rest on support member 42. At this point, deflection/retention feature 46 acts to retain board 14 in place. In this embodiment, feature 46 protrudes slightly above board 14 after board 14 has been inserted into its final position.

The present invention securely retains circuit board 14 in housing 12. However, if desired, circuit board 14 can be easily removed by flexing board 14 upward and pulling board 14 out.

The present invention provides another advantage. Since it is so simple to install board 14 into housing 12, the housings can be shipped to the circuit board vendor, and the circuit board vendor simply snaps the circuit boards into the housing. Not only does this eliminate the need to assemble assembly 10 later, but it also reduces shipping costs by allowing the circuit board vendor to use the housing as a part of a secure shipping package for the circuit board.

Figure 6:
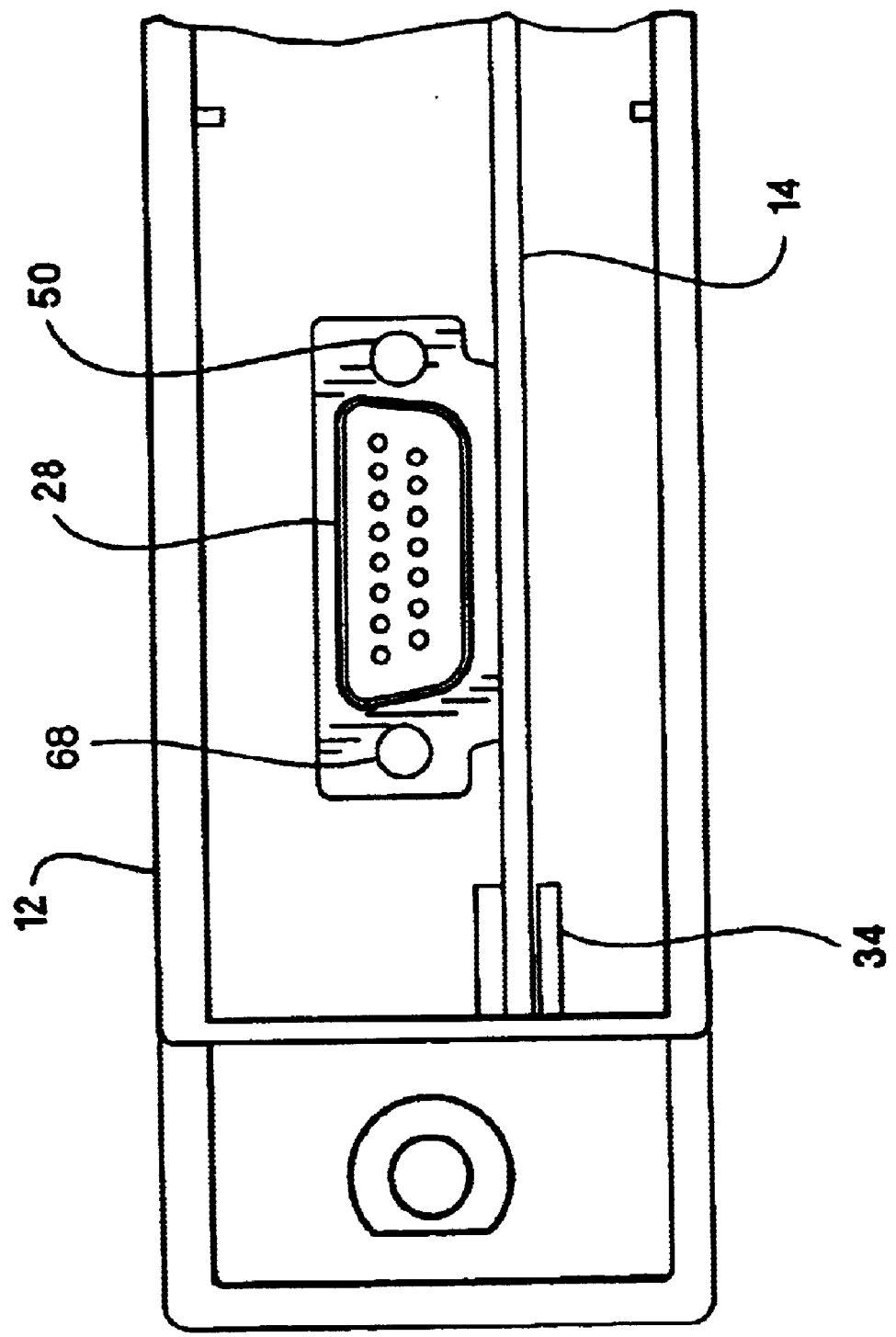
FIG. 6 is partial view showing a connector that facilitates electrical connections to the components mounted on the circuit board of the assembly.

The present invention also provides a simplified method of making the required electrical connections between assembly 10 and the computer system to which assembly 10 will be mounted. FIG. 6 is partial view of assembly 10 showing connector 28. In this embodiment, connector 28 is a conventional 15-pin connector having mounting holes 48 and 50. In prior art applications of connectors similar to connector 28, holes 48 and 50 are typically used to couple the connector to a connector of the opposite gender using threaded fasteners.

Figure 7:
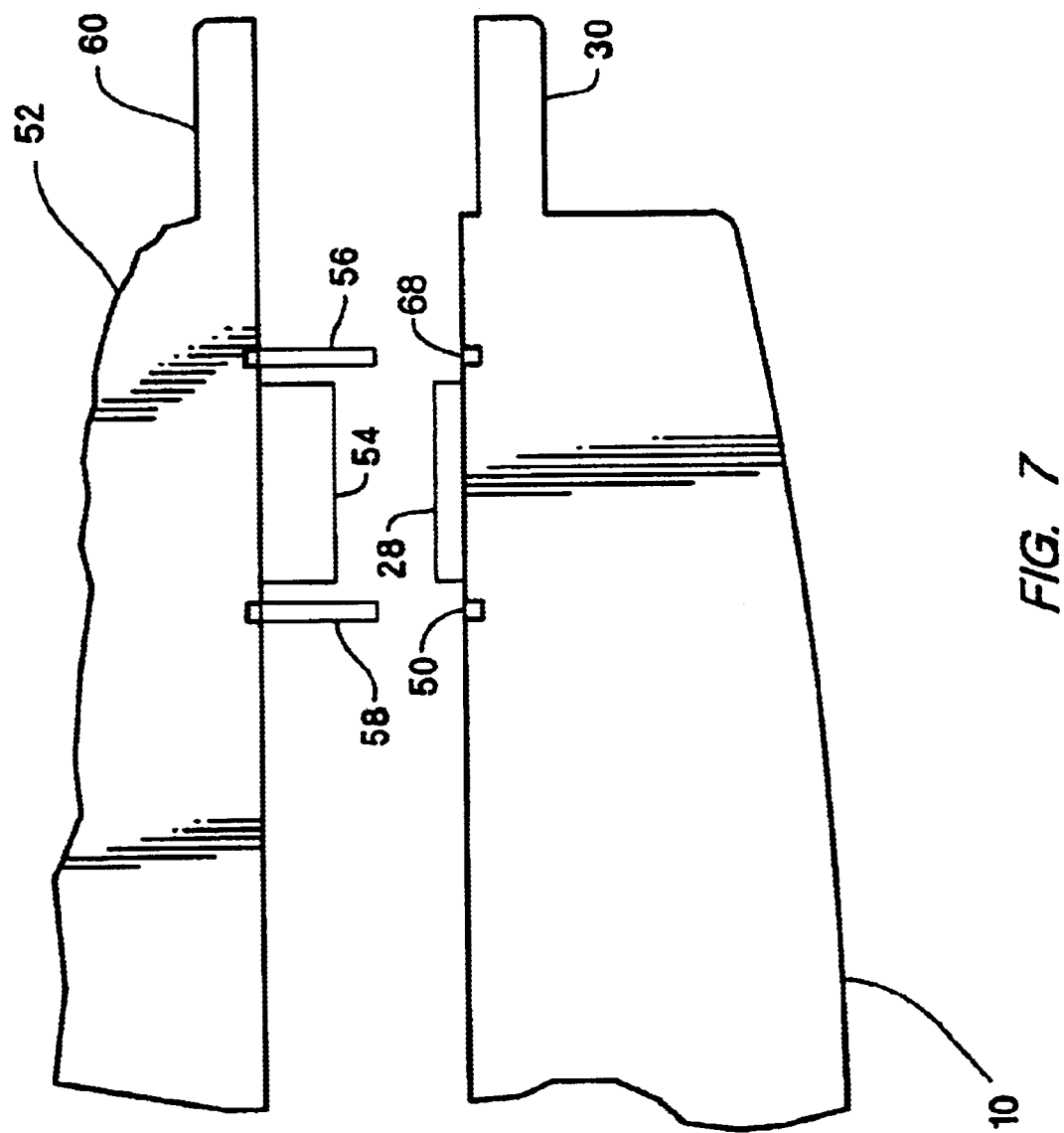
FIG. 7 shows the assembly just before the assembly is mounted to a system, with a pair of tapered alignment posts on a corresponding connector of the system aligned proximate a pair of guide holes on the connector of the assembly.

FIG. 7 shows assembly 10 just before assembly 10 is to be mounted to computer system 52. Computer system 52 includes connector 54, which is the opposite gender of connector 28. Coupled to connector 54 are tapered alignment posts 56 and 58, which may be coupled to the mounting holes of connector 54 using methods known in the art. Note that the surfaces of tapered alignment posts 56 and 58 that engage holes 68 and 50 are not threaded.

Accordingly, when a technician seeks to assemble assembly 10 to computer system 52, the technician simply aligns tapered alignment posts 56 and 58 with holes 68 and 50, respectively. As the technician urges assembly 10 closer to computer system 52, tapered alignment posts 56 and 58 and holes 68 and 50 align connectors 28 and 54, thereby simplifying the connection. Thereafter, the technician simply fastens assembly 10 to computer system 52 by inserting a conventional fastener, such as a bolt or screw, through hole 30 of assembly 10 into hole 60 of computer system 52. In addition, a similar fastener is inserted into hole 32 (at the other end of assembly 10) into a corresponding hole of computer system 52, which is not shown in FIG. 7. Of course, any other fastening method known in the art may be used to fasten assembly 10 to computer system 52. Note that the alignment posts do not necessarily need to be tapered, though tapered alignment post do simplify the initial insertion of the alignment posts into the corresponding holes. Also note that the alignment posts may be provided on connector 28, or one post may be provided on connector 28 and the other post may be provided on connector 54.

The present invention provides a simple method of installing a circuit board into a housing to form an assembly, and then electrically coupling the assembly to the system to which it will be mounted. While the present invention has been described herein with reference to a display housing having switches and indicator lights mounted on a circuit board, the present invention may be used in any application where it is desirable to mount a circuit board in a housing and make electrical connections to the board. The key to the present invention the cooperation between the slots and deflection/retainment feature, which allows the board to be flexed slightly as it is installed, and retains the board after it snaps into place, along with the connectors having the tapered alignment posts and corresponding holes, which simplify the electrical connections to the board.

Although the present invention has been described with reference to preferred embodiments, workers skilled in the art will recognize that changes may be made in form and detail without departing from the spirit and scope of the invention.

What is claimed is:

1. A method of assembling a circuit board into a housing to form an assembly comprising:

inserting a first end of the circuit board into a first slot of the housing;

flexing the circuit board over a deflection/retention feature;

inserting a second end of the circuit board into a second slot of the housing; and pressing the circuit board into place until the circuit board clears the deflection/retention feature and snaps into place, thereby returning a substantially flat state wherein inserting a first end of the circuit board into a first slot of the housing and inserting a second end of the circuit board into a second slot of the housing each include simplifying initial alignment of the circuit board into the slot by first contacting a lower surface of the slot that extends farther from a front of the housing than an upper surface of the slot.

2. The method of claim 1 wherein inserting a second end of the circuit board into a second slot of the housing includes engaging a curved guide proximate the second slot that urges the circuit board toward the second slot.

3. The method of claim 1 wherein pressing the circuit board into place until the circuit board clears the deflection/retention feature and snaps into place includes engaging a curved guide proximate the deflection/retention feature that urges the circuit board toward a final position.

4. The method of claim 1 wherein pressing the circuit board into place until the circuit board clears the deflection/retention feature and snaps into place includes engaging one or more supports of the housing that help retain the circuit board within the housing after the circuit board has reached a final position within the housing.

5. The method of claim 1 and further comprising:

attaching the assembly to a system by:

guiding a connector of the circuit board toward a connector of opposite gender on the system using one or more alignment posts and one or more corresponding holes, wherein the one or more alignment posts and the one or more corresponding holes are distributed among the connector of the circuit board and the connector of opposite gender on the system; and fastening the housing to the system.

6. The method of claim 5 wherein the alignment posts are tapered.

7. A method of assembling a circuit board into a housing to form an assembly, and fastening the assembly to a system comprising:

inserting a first end of the circuit board into a first slot of the housing by first contacting a lower surface of the first slot that extends farther from a front of the housing than an upper surface of the first slot;

flexing the circuit board over a deflection/retention feature by engaging a first curved guide proximate a second slot that urges the circuit board toward the second slot;

inserting a second end of the circuit board into the second slot of the housing by first contacting a lower surface of the second slot that extends farther from a front of the housing than an upper surface of the second slot;

pressing the circuit board into place to engage a second curved guide proximate the deflection/retention feature that urges the circuit board toward a final position until the circuit board clears the deflection/retention feature and snaps into place and engages one or more supports that help retain the circuit board within the housing, with the circuit board returning to a substantially flat state; and attaching the assembly to a system by:

guiding the circuit board toward a connector of opposite gender on the system using one or more tapered alignment posts and one or more corresponding holes, wherein the one or more alignment posts and the one or more corresponding holes are distributed among the connector of the circuit board and the connector of opposite gender on the system; and fastening the housing to the system.

* * * * *